United States Patent
Bellman et al.

(10) Patent No.: US 6,982,001 B2
(45) Date of Patent: Jan. 3, 2006

(54) DEHYDROXYLATION AND PURIFICATION OF CALCIUM FLUORIDE MATERIALS USING A HALOGEN CONTAINING PLASMA

(75) Inventors: Robert A. Bellman, Painted Post, NY (US); Dana C. Bookbinder, Corning, NY (US); Kishor P. Gadkaree, Big Flats, NY (US); Cynthia B. Giroux, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/856,633

(22) Filed: May 28, 2004

(65) Prior Publication Data

US 2005/0263064 A1    Dec. 1, 2005

(51) Int. Cl.
*C30B 11/00* (2006.01)
*C30B 11/12* (2006.01)

(52) U.S. Cl. .............................. 117/11; 117/81; 117/83

(58) Field of Classification Search .................. 117/11, 117/81, 83
See application file for complete search history.

(56) References Cited

U.S. PATENT DOCUMENTS

| | | | |
|---|---|---|---|
| 4,379,733 A | 4/1983 | Pastor ......................... | 156/616 |
| 6,238,479 B1 | 5/2001 | Oba ............................ | 117/68 |
| 6,270,570 B2 | 8/2001 | Ohba et al. .................. | 117/76 |
| 6,309,461 B1 | 10/2001 | Gianoulakis et al. ....... | 117/206 |
| 6,364,946 B2 | 4/2002 | Staeblein et al. ............. | 117/81 |
| 6,562,126 B2 | 5/2003 | Price ........................... | 117/81 |
| 2003/0070606 A1 | 4/2003 | LeBlond ..................... | 117/84 |

FOREIGN PATENT DOCUMENTS

| | | |
|---|---|---|
| EP | 1234898 A1 | 8/2002 |
| WO | WO02/063076 | 8/2002 |

OTHER PUBLICATIONS

"X-ray Photoelectron spectroscopy Study of Water Absorption in $BaF_2$ (111) Surfaces", Yutong Wu, et al., *Langmuir* 1994, vol. 10, pp. 1482-1487.

"Czochralski growth of UV grade $CaF_2$ single crystals using $ZnF_2$ additive as scavenger", J. M. Ko, et al *J. Crystal Growth* 222 (2001) 243-248.

"Crystal growth of metal fluorides for $CO_2$ laser operation. I. The neccessity of the RAP approach", R. C. Pastor, *J. Crystal Growth* 200 (1999) 510-514.

(Continued)

*Primary Examiner*—Felisa Hiteshew
(74) *Attorney, Agent, or Firm*—Walter M. Douglas

(57) ABSTRACT

The invention is directed to a process of purifying metal fluoride materials used to make metal fluoride single crystals suitable for making optical elements used in the transmission of wavelengths below 200 nm, and in particular to a process of purifying such materials by the use of a halogen containing plasma to convert metal oxygenates contaminating the feedstocks used in the preparation of the crystals to metal fluorides. The invention also is directed to a process of growing a metal fluoride single crystal using a crystal growth furnace to carry out the foregoing purification procedure followed by the steps of melting the purified material and cooling it using s selected time and temperature cycle to from a metal fluoride single crystal. The plasmas used in practicing the invention can be derived from a variety of halogenated materials including, for example, fluorocarbons, chlorocarbons, boron trihalides, chlorine, fluorine, xenon difluoride and other gaseous or easily volatilized halogenated substances known in the art.

11 Claims, 4 Drawing Sheets

OTHER PUBLICATIONS

"Crystal growth of metal fluorides for $CO_2$ laser operation. II. Optimization of the reactive atmosphere process (RAP) choice.", R.C. Pastor *J. Crystal Growth* 203 (1999) 421-424.

"Study of Absorption on Radiation-Damaged $CaF_2$(111) surfaces", V. M. Bermudez, *Applied Surface Science*, 2000, vol. 161, pp. 227-239.

"Growth of ultra-violet grade $CaF_2$ crystals and their application for excimer laser optics.", J.T. Mouchovski, et al., *J. Crystal Growth* 162 (1996) 79-82.

"Density functional theory calculations of adsorption of water at Calcium Oxide and calcium fluoride surfaces", N. H. de Leeuw, et al *Surface Science* (May 1, 2000), vol. 452 (1-3), pp. 9-19.

"Electron- and photon-stimulated metallization and oxidation of the CaF2 (111) surface", M. Reichling, et al *Surface Science* (May 15, 1998), vol. 404 (1-3), pp. 145-149.

"Degradation of the $CaF_2$ (111) surface by air exposure", M. Reichling, et al *Surface Science* (Sep. 20, 1999), vol. 439 (1-3) pp. 181-191.

"In Situ Vibrational Spectroscopic Studies of the $CaF_2/H_2O$ Interface" Becraft, et al American Chemical Society Web Nov. 8, 2001.

DEHYDROXYLATION AND PURIFICATION OF CALCIUM FLUORIDE MATERIALS USING A HALOGEN CONTAINING PLASMA

FIELD OF THE INVENTION

The invention is directed to a process of purifying metal fluoride materials used to make metal fluoride single crystals suitable for making optical elements used in the transmission of wavelengths below 200 nm, and in particular to a process of purifying such materials by the use of a halogen containing plasma to convert metal oxygenates contaminating the feedstocks used in the preparation of the crystals to metal fluorides.

BACKGROUND OF THE INVENTION

The burden of the demands for improved performance of computers and other electronic devices falls on the lithographic processes used to fabricate integrated circuit chips. Lithography involves irradiating a mask and focusing the pattern of this mask through an optical microlithography system onto a wafer coated with a photoresist. The pattern on the mask is thereby transferred onto the wafer. Decreasing the line-widths of the features on a given wafer enables the writing on a wafer of more elements per unit area and consequently brings about advances in performance. The enhanced resolution required to achieve finer line-widths is enabled by decreasing the wavelength of the illumination source. As a result of the desire to achieve finer line widths, the energies used in lithographic patterning are moving deeper into the UV region. Consequently, optical components capable of reliable performance at these increasingly shorter optical microlithography wavelengths are required.

Few materials are known that have a high transmittance at wavelengths below 200 nm, for example, at 193 nm and 157 nm, and also do not deteriorate under exposure to intense laser radiation. Fluoride crystals such as those of magnesium fluoride, calcium fluoride and barium fluoride are potential materials with high transmittance at wavelengths <200 nm. Calcium fluoride crystals are particularly preferred for making optical elements for use at below 200 nm wavelengths. However, the commercial use and adoption of below 200 nm wavelengths has been hindered by the transmission nature of such deep ultraviolet wavelengths through optical materials and by the lack of economically manufacturable, high quality blanks of optically transmissive materials suitable for below 200 nm microlithography optical elements. Many factors go into making metal fluoride crystals and elements suitable for use in below 200 nm lithography. One of these is the purity of the metal fluoride starting material or feedstock used to make a metal fluoride single crystal and subsequently an optical element.

The transmission of a metal fluoride crystal is greatly dependent on the purity of the starting material. Commercially available raw material powders are sufficiently pure in terms of cationic impurities, but these materials are not sufficiently pure in terms of the anionic impurities they contain. In order to remove these anionic impurities, mainly oxygen containing species, a purification step is carried out using a gaseous or a solid oxygen scavenger, or both, such as known in the art. Examples of such scavengers are solid lead fluoride ($PbF_2$), zinc fluoride ($ZnF_2$) or gaseous carbon tetrafluoride ($CF_4$). There are numerous patents and technical articles whose authors discuss the detrimental effects of water and oxygen, and the necessity for adding an oxygen scavenger to remove these contaminants. For examples, see:

J. M. Ko et al., "Czochralski growth of UV grade $CaF_2$ single crystals using $ZnF_2$ additive as scavenger", *J. Crystal Growth* 222 (2001) 243–248 [with references to the use of $PbF_2$ and $CF_4$ as scavengers];

R. C. Pastor, "Crystal growth of metal fluorides for $CO_2$ laser operation. I. The necessity of the RAP approach", *J. Crystal Growth* 200 (1999) 510–514, and "Crystal growth of metal fluorides for $CO_2$ laser operation. II. Optimization of the reactive atmosphere process (RAP) choice.", *J. Crystal Growth* 203 (1999) 421–424;

J. T. Mouchovski et al., "Growth of ultra-violet grade $CaF_2$ crystals and their application for excimer laser optics.", *J. Crystal Growth* 162 (1996) 79–82;

K. A. Becraft et al., "In Situ Vibration Spectroscopic Studies of the $CaF_2/H_2O$ Interface". *Langmuir* 2001, Vol. 17, pages 7721–7724;

Yutong WU et al., "X-ray Photoelectron spectroscopy Study of Water Absorption in $BaF_2$ (111) Surfaces", *Langmuir* 1994, Vol. 10, pages 1482–1487;

V. M. Bermudez, "Study of Absorption on Radiation-Damaged $CaF_2$ (111) surfaces", *Applied Surface Science*, 2000, Vol. 161, pages 227–239;

N. H. de Leeuw et al., "Density functional theory calculations of adsorption of water at Calcium Oxide and calcium fluoride surfaces", Surface Science (May 1, 2000), Vol. 452 (1–3), pages 9–19;

M. Reichling et al., "Degradation of the $CaF_2$ (111) surface by air exposure". Surface Science (Sep. 20, 1999), Volume 439 (1–3) Pages 181–191; and M. Reichling et al., "Electron- and photon-stimulated metallization and oxidation of the $CaF_2$ (111) surface", *Surface Science* (May 15, 1998), Vol. 404 (1–3), pages 145–149.

See also U.S. Pat. Nos. 4,379,733 and 6,238,479 B1, 6,270,570, 6,364,946 B2; European Patent Application Publication No. EP 1 234 898 A1; and PCT Patent publication WO 02/063076 A1.

In a typical process for removing oxygen-containing anionic impurities from a metal fluoride raw material, a metal fluoride powder is melted in the presence of an oxygen scavenger. The scavenger reacts with the oxygen containing species and converts it to a fluoride material. The resulting melt or liquid is then quickly cooled down in order to obtain a purified, high density metal fluoride material that will be used in crystal growth furnaces to fabricate the desired metal fluoride crystal. This specific purification-melting process of the raw material powder is generally called a "premelt" step or "cullet" production.

For below 200 nm lithographic optical material, the quality of the premelt material may be quantified by determining the transmission characteristics of the premelt material in the wavelength range of 120–220 nm. In the absence of specific absorptions in VUV range at 130 nm, 150 nm and 193 nm, the premelt material is characterized as being an oxygen-free or substantially oxygen free material and hence suitable for making metal fluoride single crystals. Once the premelt's suitability for use in growing crystals has been determined, the premelt material is broken into pieces or ground into fine particles and loaded into crucibles that are placed in a crystal growth furnace. However, if the oxygen-free premelt material is loaded into the crucible without the addition of an oxygen scavenger, or if the crystal growth is carried out in the absence of a gaseous oxygen scavenger, the crystal produced in the growth furnace will exhibit the characteristic oxygen absorption bands in the 120–220 nm range. The presence of these bands indicates that the oxygen-free premelt material has been re-contaminated by the formation of oxygen containing substances during handling and/or during the crystal growth process. The sources of contamination can be oxygen containing substances (for example, $H_2O$, $O_2$, $CO_2$ and other oxygen containing species) adsorbed on the surface of the premelt particles while they are being prepared for the crystal growth process or they can come from oxygen containing substances released from the materials used to make either the furnace or the components used in the crystal growth process. For example, the oxygen containing substances can be released from the crucibles, heating elements, and insulating parts of the furnace among others. In any event, when the furnace is heated in the absence of an oxygen scavenger, metal fluoride premelt material fluoride reacts with these oxygen containing substances and this in turn gives rise to a low transmittance crystal. For example, if water vapor is released from the insulation, the vapor can react with the metal fluoride to form a hydroxy metal fluoride. For example, $CaF_2+H_2O \rightarrow Ca(OH)F+HF\uparrow$ or $CaO+2HF\uparrow$.

While the use of an oxygen scavenger during the crystal growth process can alleviate the oxygen contamination problem, such use can give rise to additional problems. For example, one must estimate the amount of contaminants present in the material and use sufficient scavenger to remove all of it. This is frequently difficult to determine. As a result, excess oxygen scavenger is used in the crystal growing process. While the use of excess scavenger does not present problems when the scavenger is gaseous, when a solid scavenger such as $PbF_2$ is used, the excess of scavenger could result in lead contamination of the grown crystal. If insufficient scavenger is used, then residual oxygen containing substances may be present in the grown crystal and these substances will absorb radiation in the 120–220 nm regions, and consequently interfere with the transmission properties of the crystal and optical element made from it. Transmission of 96%/cm or greater at 157 nm and 99%/cm or greater at 193 nm of incident radiation is required for elements used in below 200 nm lithography.

Therefore, in view of the foregoing problems it is desirous to be able to identify other process of removing oxygen containing species from the metal fluoride materials used in the preparation on metal fluoride single crystals. Accordingly, the present invention is directed to the use of a halogen containing plasma to remove oxygen containing substances present in either a metal fluoride feedstock or arising from the surfaces or from the materials present in the interior of a crystal growth furnace.

SUMMARY OF THE INVENTION

The invention is directed to a process by which moisture ($H_2O$), oxygen, metal oxides or other metal oxygenates are removed from a metal fluoride raw material or feedstock that is used in the preparation of metal fluoride single crystals by the use of a halogen containing plasma at temperatures below 800° C. In the process the metal oxygenates are converted to metal fluorides. In particular, the invention is directed to the preparation of metal fluorides of formula $MF_2$ where M is calcium, barium, magnesium and strontium, or a mixture thereof.

The invention is further directed to removing oxygen and moisture from the interior elements of a furnace, including vessels containing the metal fluoride material, by the use of a halogen containing plasma so that such oxygen and moisture does not react with the metal fluoride during a crystal growth process. This "furnace cleansing" process can be conducted simultaneously with the purification of the metal fluoride materials as described herein.

The invention is further directed to a method for growing a metal fluoride single crystal having at least the steps of:
placing a metal fluoride material of formula $MF_2$, where M and M' may be the same or different, in a vessel;
placing the vessel in a crystal growth furnace;
reducing the pressure in the crystal growth furnace to a pressure of less than $10^{-3}$ mm Hg;
exposing the fluoride material and surfaces in the furnace to a halogen containing plasma at a pressure in the range of 0.1–150 mm Hg and a temperature in the range 200–800° C. for a selected time in the range of 1–120 hours;
stopping the flow of plasma and reducing the pressure in the furnace to less than $10^{-3}$ mm Hg;
heating the fluoride material to a temperature above its melting point; and
cooling the melted fluoride material to form a metal fluoride single crystal suitable for below 200 nm optical lithography.

DETAILED DESCRIPTION OF THE INVENTION

Figure 1:
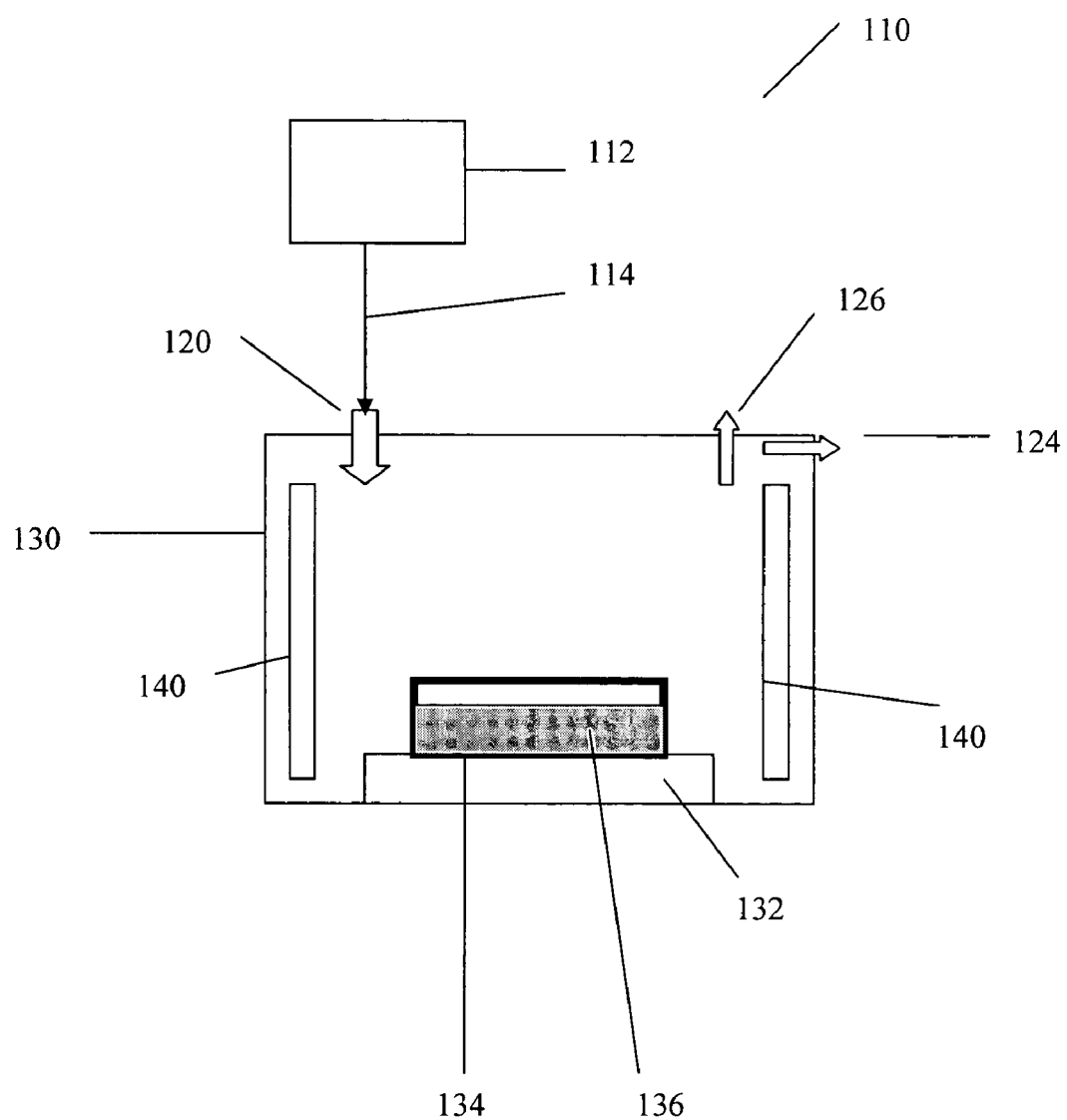
FIG. 1 illustrates an apparatus for treating a metal fluoride material using a plasma generator and a furnace containing a metal fluoride material in a crucible or other vessel.

The invention is directed to a process of preparing metal fluoride single crystals of formula $MF_2$, where M is calcium, barium, magnesium and strontium, or a mixture thereof. The invention is thus directed to a single-metal crystals of formula $MF_2$ such as $CaF_2$ (where M is Ca only), and to mixed-metal crystals of formula $M_{1-x}M'_xF_2$, for example, $Ca_{1-x}Ba_xF_2$ where M and M' are different and x is any value greater than zero to less than 1 (0<x<1). In such mixed-metal crystals M and M' are different and are selected from the group consisting of calcium, barium, magnesium and strontium.

The process of the invention can be used to separately prepare a feedstock suitable for growing metal fluoride single crystals by treatment of a raw material, usually in powdered form, or it can be used as part of the part of the crystal growth procedure. The feed stock can be a single metal fluoride suitable for growing a crystal of formula $MF_2$ or a combination of metal fluorides suitable for growing a mixed-metal fluoride of formula $M_{1-x}M'_xF_2$. In addition, the process of the invention can be used in conjunction with more conventional solid or gaseous oxygen scavengers such as $PbF_2$, $ZnF_2$, $CF_4$ and others known in the art. The process of the invention can also be used to prepare feed stocks of formula M"F where M is an alkali metal, or mixture of alkali metals.

In the semiconductor industry, fluorine plasma is often used to clean substrates, strip photoresists from surfaces, and etch silicon and other oxides, silicon nitride, and some metals. The fluorine plasmas are typically formed in a vacuum chamber with the flow of a fluorinated gas such as fluorocarbons ($CF_4$, $CHF_3$, $C_2F_6$, $C_4F_8$, and cyclo-$C_4F_8$), $NF_3$, or $SF_6$. Although some metals are etched with fluorine plasmas, more typically metals are etched with a chlorine plasma formed in vacuum from the disassociation of gaseous $Cl_2$, $BCl_3$, or from chlorinated hydrocarbons such as dichloroethylene. Metals can also be etched using a bromide plasma formed from the dissociation of $Br_2$ or $BBr_3$.

A variety of methods of producing plasmas are known in the art and can be used in practicing the invention. Examples include, without limitation, those that use parallel plate electrodes, inductive coils, helicons, ECR, and microwave sources to produce plasmas. When fluorine plasmas are produced by these methods, the resulting highly reactive fluorinated species react with metals and metal oxides on the semiconductor surface to form volatile metal halides and oxyhalides. Etching of the semiconductor surface occurs as these volatile species exit the surface undergoing treatment and enter the gas stream. In semiconductor applications the choice of halide is used in generating the plasma is typically dictated by the vapor pressures of the metal halides and oxyhalides formed. Hydrocarbons are removed from the surfaces as halogenated hydrocarbons and polymers, and water is removed from the surfaces as HF, HCl, HBr, or HI. Surface hydroxyls (—OH) are typically displaced to leave a halogen terminated surface. Collisions with the activated ions also are known to displace adsorbed surface species.

In an alternative process that reduces damage to a semiconductor work piece, the work piece is placed downstream of the plasma source. In this case the reactive plasma species (both radicals and ions) can react with the work piece without exposing it directly to the intense UV radiation and electron bombardment of the plasma. This procedure is commonly used for stripping photoresists, chamber etchback, cleaning surfaces for PECVD (plasma enhanced chemical vapor deposition) and surface modifications.

The present invention is directed to the purification of metal fluoride materials by treatment with a halogen containing plasma, preferably a fluorine containing plasma. With regard to the metal fluoride materials used to grow single crystals suitable for <200 nm lithography, an appropriate plasma can react with various oxygenated metal species that may be present in a metal fluoride raw material or feedstock. For example, alkaline earth metal fluorides ($MF_2$) can react with water to form metal oxides [MO], metal hydroxides [$M(OH)_2$], and metal hydroxy fluorides [MF(OH)]. A fluorine or chlorine plasma will react with such species to form, for example, $MF_2$ and oxygenated waste products that are volatile and can be evacuated from the treatment system. In addition, the plasma will react with any water present in a furnace or other equipment elements within the furnace being utilized in the process. The products of such reactions are likewise evacuated from the system.

The invention is directed to a process of using a halogen containing plasma by which moisture, oxygen, metal oxides and metal impurities are removed from a metal fluoride precursor material, the graphite or other crucible material typically used to contain the metal fluoride material, and the furnace interior components after the crucible containing the fluoride material has been loaded into the furnace. The process is carried out at a low temperature, for a time in the range of 1–120 hours, in order to avoid having the oxygen and moisture that may be present within the furnace from further contaminating the fluoride material by reacting with it as the material is heated. Once the oxygen and moisture are removed and metal oxygenates are converted to metal fluoride, the metal fluoride material can be used to grow metal fluoride single crystals suitable for <200 nm lithography.

In the process of the invention the fluoride precursor materials are loaded into a crucible, preferably a graphite crucible that may or may not be covered with a lid. Preferably the crucible and/or its lid are porous. The crucible is then placed into a chamber of a furnace capable of reaching temperatures greater than the melting point of the metal fluoride material; for example, a Bridgman-Stockbarger type furnace. The furnace is then evacuated to a pressure sufficient for plasma generation, a pressure in the range of 0.1 to 150 Torr (0.1–150 mm Hg), preferable in the range of 5–100 mm Hg. Reactive halogenated species in the form of a plasma that is generated upstream of the metal fluoride material by a plasma generator is then admitted into the furnace chamber containing the metal fluoride material. The plasma species are generated by an upstream (from the $CaF_2$) plasma source in an adjacent tube or chamber. Commercially available plasma generators such as those available from MKS Instruments, Wilmington, Mass., can be used in practicing the invention.

The source of the reactive halogenated species contained in the plasma may be, for example, a fluorinated gas such as $CF_4$, $CHF_3$, $C_2F_6$, $C_4F_8$, and other fluorinated alkyls, fluorocarbons that contain other halogens such as chlorofluorocarbons (for example, $CF_2Cl_2$, $C_2F_4Cl_2$, and other chlorofluorocarbons known in the art), $NF_3$, $SF_6$, $F_2$ and HF. Other substances than can be used in the plasma generator for making reactive species include volatile metal fluorides which can form oxides volatile below the melting temperature of the metal fluoride being purified.

In addition to the foregoing, chlorine and bromine containing species can also be used in the plasma generator to effect the removal of water vapor from the furnace and its contents. Such species may or may not contain fluorine. However, in the cases where such chlorine or bromine species do not contain fluorine, after an initial treatment with such non-fluorine containing species the metal fluoride material in the furnace is subsequently treated with a fluorine containing plasma to insure that the metal fluoride material after treatment does not contain chlorine or bromine. Chlorinated species that can be used in the plasma generator include $Cl_2$, HCl, $BCl_3$, chlorinated hydrocarbons such as $CCl_4$, $CH_2Cl_2$, HCl and other volatile chlorocarbons known in the art, especially fluorochlorocarbons. Bromide sources include $Br_2$, HBr, $BBr_3$, brominated hydrocarbons, and brominated hydrocarbons that contain other halogens, especially bromofluorocarbons. The choice of plasma source, pressure, gas flow and composition will greatly influence both the concentration and lifetime of the excited fluorinated species formed.

In one embodiment of the invention the plasma containing the reactive species is admitted into the chamber and the plasma is allowed to simply diffuse through the metal fluoride powder being treated. In another embodiment the reactive plasma species is distributed into the furnace using a gas manifold which may include one or more tubes placed into the metal fluoride powder mixture.

In a further embodiment, an inert carrier gas such as He or Ar may be added to improve uniformity and distribution of the reactive plasma.

In yet another embodiment, the powder may be placed in a rotary vessel such that the metal fluoride material tumbles with rotation. This method will help to ensure that all surfaces of the powder are treated with the plasma containing the reactive species.

In all the foregoing embodiments, the plasma is also brought into contact furnace elements including the walls, heaters, vessels containing the metal fluoride and any other elements contained within the furnace. When a porous crucible, including an optional porous lid, is used to contain the metal fluoride material, the plasma can also diffuse through the walls of the crucible and the lid.

When the reactive species in the plasma contain chlorine or bromine, after a first treatment with such species the metal fluoride material is further treated with a second plasma containing a reactive halogen of lower atomic weight, preferably fluorine, in order to further purify the precursor and furnace, and to displace any contamination from the heavier halogen. For example, if the metal fluoride material is first treated with plasma derived from $Cl_2$, $Br_2$, $BCl_3$, $C_2Cl_4$ or other such chloro or bromo substances that do not contain fluorine, the metal fluoride powder is treated with a second plasma containing only or a preponderance of fluorine as the reactive halogen species. Thus, after using a first plasma generated using $BCl_3$ or $BBr_3$, the metal fluoride is subsequently treated with a second plasma generated using $F_2$, $CF_4$, $C_2F_4$, $C_2F_4Cl_2$ or other fluoro-containing species known in the art such as $XeF_2$. The preferred plasma sources containing fluorine are $F_2$, $XeF_2$ and the $C_1$–$C_4$ fluorocarbons, including cyclo-$C_4F_8$.

The halogen containing gas forming the plasma can be activated by UV light or heating it in a chamber in a separate from the chamber containing $CaF_2$ powder. The activated halogen containing gas is then fed into directly into the chamber containing metal fluoride raw material. The chamber and the metal fluoride material therein are heated to a temperature in the range of 100–800° C. In more preferable embodiments the heating is to a temperature of 500° C. or less, and most preferably to a temperature of 300° C. or less. In cases where the plasma contains only fluorine as the reactive halogen, or a molar preponderance of fluorine over other halogens, the heating can be to a temperature of 200° C. or less. In the case of where the only halogen in the plasma is chlorine, the chamber containing the metal fluoride raw material can be at higher temperatures, for example, a temperature in the range of 500–800° C.

While high temperature treatment of the metal fluoride material can be carried out using any halogen containing plasma as taught herein, it is advantageous to carry out the treatment using a fluorine containing plasma at temperature of less than 500° C., and preferably less than 300° C., because most of the oxygen and water vapor in the furnace is removed prior to its reacting with the metal fluoride material to form oxygenated metal fluorides such as those described above.

The metal fluoride materials that are plasma treated according to the invention can be of any particle size, ranging from a powder to solid blocks of metal fluoride material formed by other methods. When treating material for the purpose of making metal fluoride single crystals, it is preferred that the material have particle size of 5 mm or less, including powders. Solid blocks of metal fluoride materials, for example, single crystals formed independently of the invention, can be treated using plasma in accordance with the invention to remove surface oxygenated species.

The following examples are meant to illustrate the invention and are not to be taken as limiting the scope of the invention.

EXAMPLE 1

Referring to FIG. 1, the Figure illustrates a system 110 for treating a metal fluoride raw material having a plasma generator 112 having a source of a halogen or halogen-containing gas (not illustrated) and an exit port 116 (not illustrated) with connector 114 for transfer of the plasma formed by generator 112 to a furnace 130. The furnace 130 has a inlet port 120 for receiving the plasma, an outlet port 126, a port 124 for applying vacuum, heaters 140, a support 132 for one or a plurality of crucibles 134 (broad black lines, one crucible illustrated) or other vessel containing a metal fluoride powder 136, and other accessories such as temperature and pressure controllers, temperature probes or thermocouples that are not illustrated. The crucible 134 containing the metal fluoride material is placed on the support stand 132 and the furnace is evacuated to a pressure of less than $10^{-3}$ mm Hg to outgas the fluoride material, and in particular to remove oxygen and any easily removable (labile) water vapor that may be present within the chamber including its contents. The out gassing period may be a time in the range of 1–8 hours, and during this time the temperature within the furnace may be raised to a temperature in the range of 100–300° C. to facilitate the removal of labile water.

After the out gassing period has ended, a dry, non-reactive gas such as nitrogen, argon or helium is admitted to a pressure in the range of 0.1–150 mm Hg. Subsequently the temperature of the furnace is raised to at least 200° C., the plasma generator is started and plasma gas from the generator 112 is passed into the furnace 130 via connector 116 and furnace entry port 120. The pressure within the furnace is maintained in the range of 0.1–150 mm Hg, preferably 5100 mm Hg, by means of pressure controllers (not illustrates) or periodic application of vacuum. While plasma treatment of the fluoride material may be at any temperature below the melting point of the material, lower temperatures are preferred to prevent oxygen and/or water present in the system from reacting with the metal fluoride material before it can be removed via reaction with the plasma. Therefore, it is preferred that the plasma treatment be at a temperature less than 800° C.; preferably at a temperature in the range of 200–500° C., and more preferably at a temperature in the range of 200–300° C. Plasma treatment can be done for a time in the range of 1–48 hours.

Once the plasma treatment is completed, the plasma generator is shut off and the furnace is filled with a dry inert gas to atmospheric pressure and cooled to ambient temperature. Optionally, the furnace can be evacuated to a pressure of than $10^{-3}$ m Hg or less prior to filling with the inert gas. The furnace is then opened and the crucible containing the treated material is transferred to a crystal growth furnace such as illustrated in U.S. Pat. No. 6,562,126 (FIG. 9A therein [FIG. 3 in this application] illustrating a plurality of vessels). Single crystals of the metal fluoride are then grown according to time and temperature regimes known in the art, for example, those described in U.S. Pat. Nos. 6,270,570 and 6,562,126.

While crucibles or vessels used in treating the metal fluoride material as described above can be made of any material, it is preferred that they be made of carbon, either porous or non-porous, so that they can be transferred directly to the crystal growth furnace. By using carbon crucibles, if the fluoride material is exposed to the atmosphere after treatment, the time of such exposure can be minimized.

EXAMPLE 2

Figure 2:
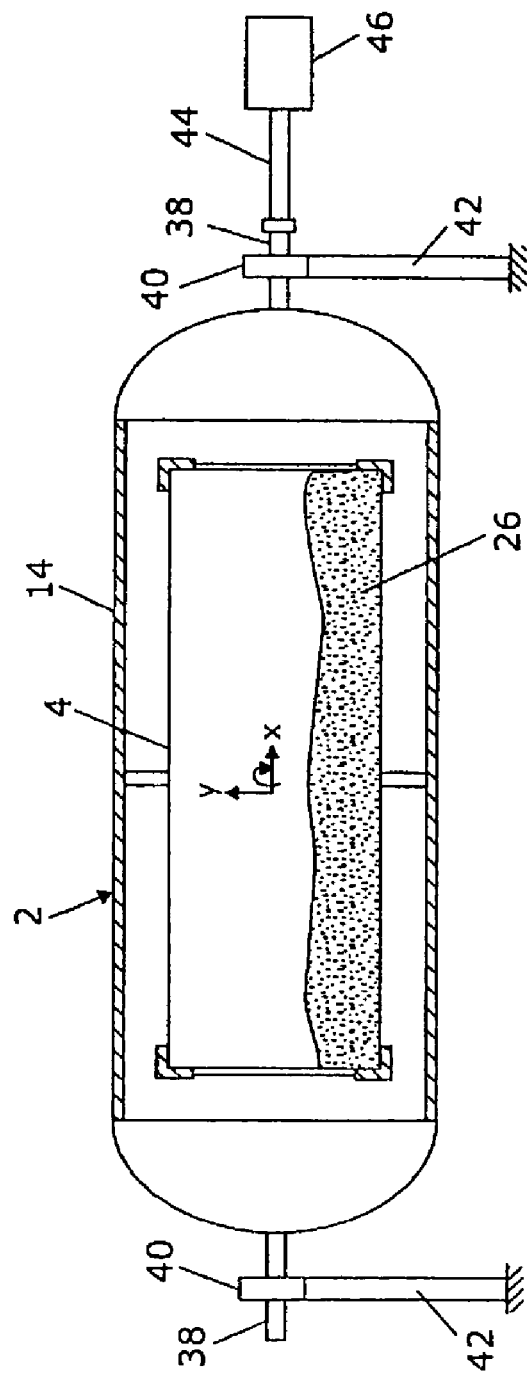
FIG. 2 illustrates an apparatus for treating a metal fluoride material using a plasma generator and a rotating vessel containing a metal fluoride material.

In this Example one uses a rotating vessel as illustrated in FIG. 2 which has been disclosed in U.S. Patent Application Publication 2003/0070606, published Apr. 17, 2003 and commonly owned along with the present application by Corning Incorporated to prepare a metal fluoride raw material for use in growing single crystals. As used in the present invention, the reaction vessel 14 has shaft ends 38 supported by bearings 40. The bearing 40 are attached to support frames 42. One side of the shafts 38 is coupled to a drive shaft 44 that is connected to a drive system 46, e.g., drive motor and gear train. The drive system 46 can be operated to rotate both the reaction vessel 14 and the reaction chamber 4. Rotary/flexible couplings (not shown) can be used to couple inlet port 16 to plasma 32 or a gas 20 source and to couple outlet port 18 to a treatment chamber 22 for treating substances exiting the vessel. During treatment with a halogen containing plasma the reaction chamber 4 is agitated by rotation, either continuously or intermittently, at a speed in the range of greater than zero to 200 rpm [>0 to 200 rpm]. The rotational speed will depend on factors such as the weight of the metal fluoride material 26 present in vessel 14 and its particle size. By rotating the vessel 14 the metal fluoride material is tumbled and continuously exposed to the halogen containing plasma. The vessel 14 can also be heated, for example by attachment of heaters to the exterior of the vessel or placing the vessel in a heating furnace with the rotational shafts 38 extending through the walls of the furnace.

The metal fluoride material present in the vessel 14 is treated with a halogen containing plasma in the same manner as in Example 1, including times and temperatures. If the vessel 14 is not equipped with heaters or placed in a furnace, the treatment if carried out at the ambient temperature of the room where the vessel is located. In the absence of heating, the duration of treatment can be extended to any time sufficient to remove water vapor and oxygen from the vessel and convert any oxygenated metal fluoride compounds (e.g., MF(OH), MO, M(OH)$_2$, Where M is Ca, Ba, Sr, Mg or a mixture thereof) to a metal fluoride only.

EXAMPLE 3

Figure 3A:
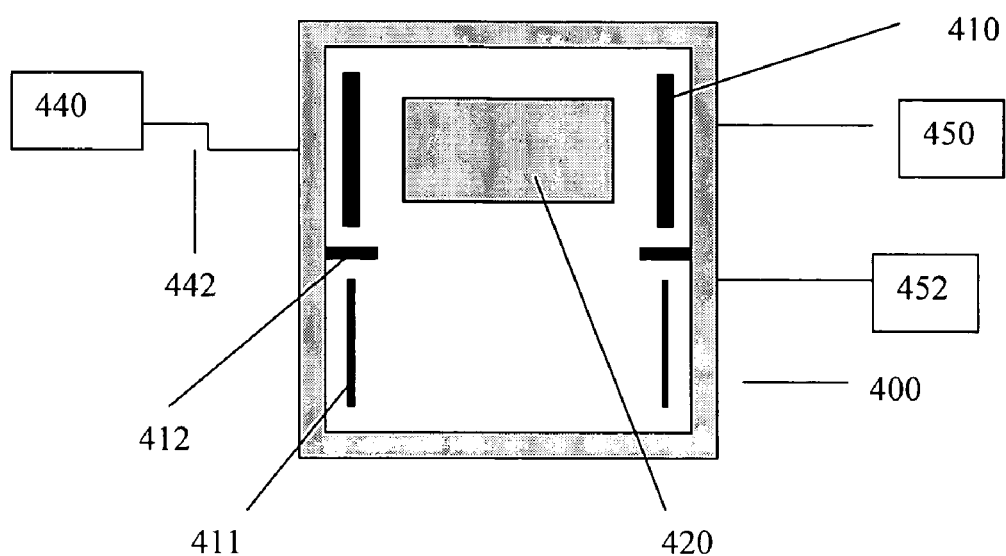
FIGS. 3A and 3B illustrate in a simplified manner an embodiment of the invention in which a crucible containing a metal fluoride raw material is placed in a crystals growth furnace, treated with plasma and then used to grow a metal fluoride single crystal.
Figure 3B:
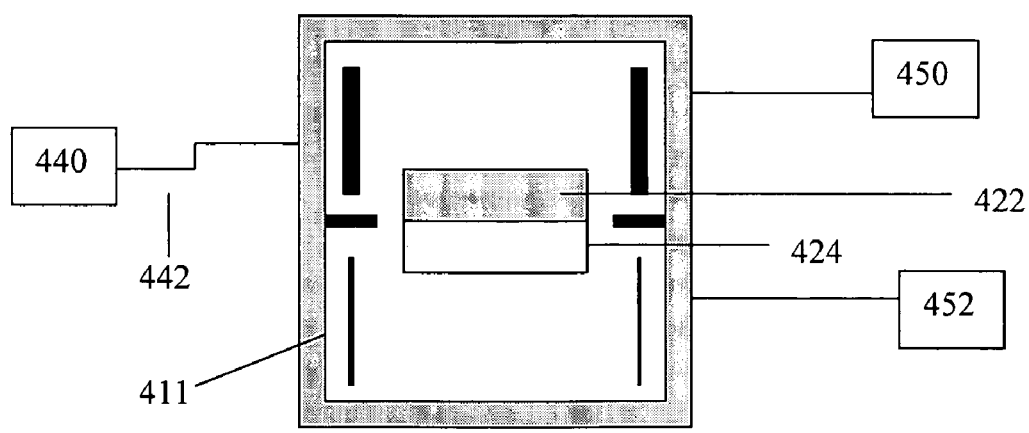

FIGS. 3A and 3B illustrate in a simplified manner an embodiment of the invention in which a crucible containing a metal fluoride raw material is placed in a crystals growth furnace, treated with plasma and then used to grow a metal fluoride single crystal. This use of this procedure avoids the re-contaminating the plasma-treated metal fluoride material during transfer from a treatment furnace to a growth furnace.

In FIG. 3A a plasma generator 440 is connected to furnace 400 via connector 442. Furnace 400 has heaters 410 and 411 that can be controlled that are separately controlled, baffles 412 that divide the furnace into two upper and lower zones, element 450 connected to the furnace via a connector for the application of vacuum, and element 452 that is connected to the furnace for the admission of selected gases, for example, inert gases such as nitrogen, helium and argon; fluorinating gases such as $CF_4$, $F_2$, $XeF_2$, $C_2F_4Cl_2$, cyclo-C $_4F_8$ and other fluorinating gases known in the art; or any other gaseous material the user needs to use. In order to keep the figure simplified addition elements such as controllers for the heaters, the mechanism for raising and/or lowering a crucible containing a metal fluoride material (illustrated as 420), an exit port for gaseous substances that may be used to sweep the furnace interior, thermocouples, and other elements known in the are to be used with crystal growth furnaces.

In the process of the invention a crucible 420 containing a metal fluoride raw material is placed in the upper part of the furnace above baffles 412 and the furnace is evacuated to a pressure of less than $10^{-3}$ mm Hg to outgas the fluoride material, and in particular to remove oxygen and any easily removable (labile) water vapor that may be present within the chamber including its contents. The out gassing period may be a time in the range of 1–8 hours, and during this time the temperature within the furnace may be raised to a temperature in the range of 100–300° C. to facilitate the removal of labile water. When a lid is not placed on the crucible, the crucible may be made of a porous or non-porous material capable of withstanding the temperatures encounter in the process; for example, porous carbon. However, when a lid is placed on the crucible, the crucible and the lid should be made of a porous material, preferably porous carbon.

After the out gassing period has ended, a dry, non-reactive gas such as nitrogen, argon or helium is admitted to a pressure in the range of 0.1–150 mm Hg. Subsequently the temperature of the furnace is raised to at last 200° C., the plasma generator 440 is started and plasma gas from the generator 440 is passed into the furnace 400 via connector 442 and a furnace plasma entry port. The pressure within the furnace is maintained in the range of 0.1–150 mm Hg, preferably 5–100 mm Hg, by means of pressure controllers (not illustrated) or periodic application of vacuum. While plasma treatment of the fluoride material may be at any temperature below the melting point of the material, lower temperatures are preferred to prevent oxygen and/or water present in the system from reacting with the metal fluoride material before it can be removed via reaction with the plasma. Therefore, it is preferred that the plasma treatment be at a temperature less than 800° C.; preferably at a temperature in the range of 200–500° C., and more preferably at a temperature in the range of 200–300° C. Plasma treatment can be done for a time in the range of 1–48 hours.

Once the plasma treatment is completed, the plasma generator is shut off and the furnace evacuated to a pressure of less than $10^{-3}$ mm Hg and the temperature within the furnace is raised to a temperature above the melting point of the fluoride material and held until all the material within the crucible has melted. Once melting is completed the crucible is slowly translated from the upper or melting zone into the lower or cooling zone by lifting/lowering mechanism (not illustrated). The lower zone is held at a temperature below the melting point of the metal fluoride material contained in the crucible. As portions of the crucible pass the baffles into the lower zone the temperature of the crucible and the molten metal fluoride material therein slowly decreases and a metal fluoride crystal begins to form. This process of cooling the melted metal fluoride material to form a metal fluoride crystal can carried out using any selected time and temperature cycle known in the art.

FIG. 3B illustrates a crucible that has partially passed baffles 412. The lower part of the crucible contains a metal fluoride crystal 424 that formed from the melt and the upper part of the crucible contains molten material. Translation continues until the crucible is completely within the lower part of the furnace below the baffles and all the molten material has been formed into a single crystal. While maintaining vacuum the temperature of the lower part of the furnace is then slowly decreased to ambient temperature according to a selected schedule such as that disclosed in the commonly owned U.S. Pat. No. 6,309,461 and other patents or publications known to those skilled in the art. An inert gas may be admitted into the furnace at a time during the cooling cycle. Once grown crystal has cooled to a temperature in the range of ambient to 200° C. and an inert gas has been admitted into the furnace the crystal may be removed from the growth furnace.

EXAMPLE 4

Figure 4:
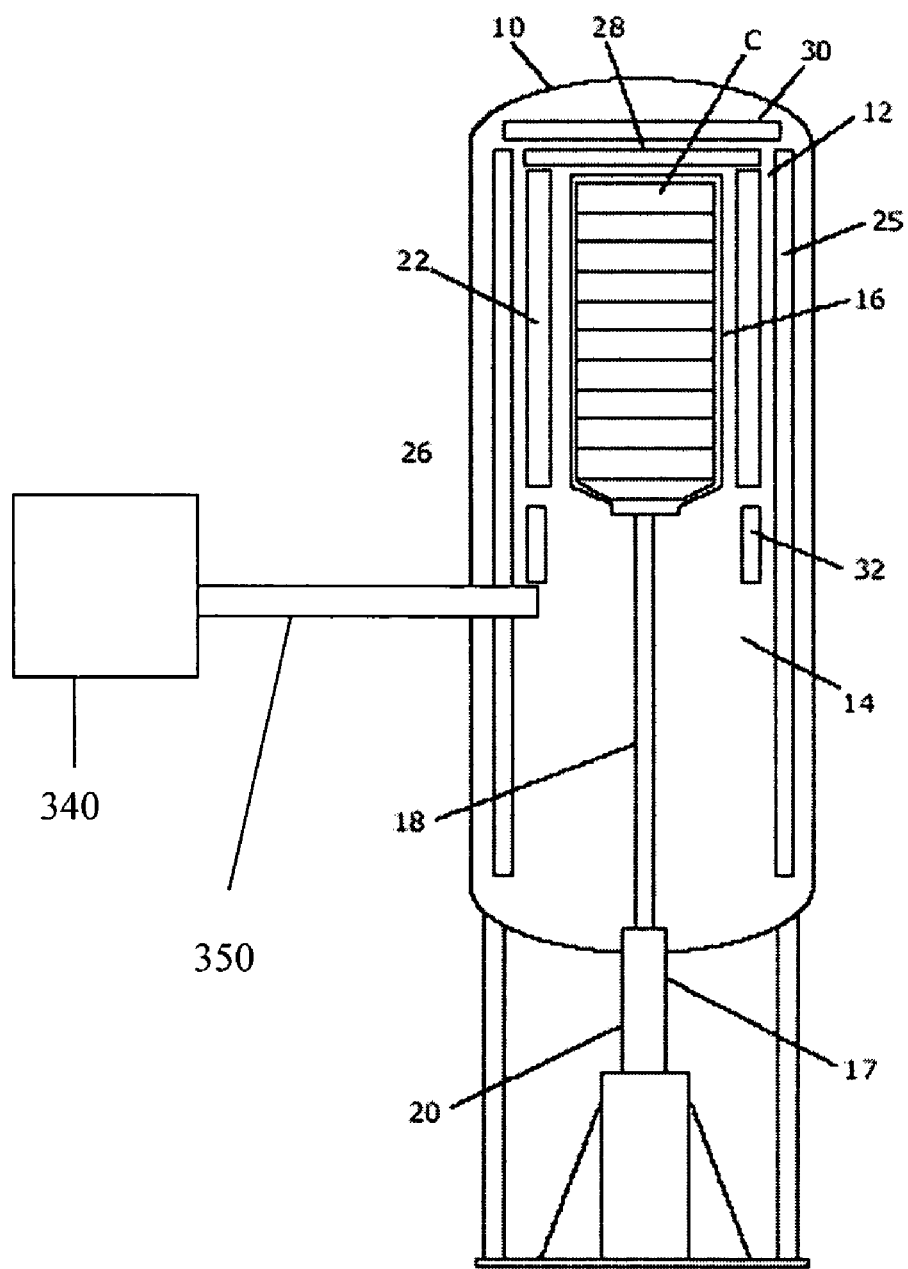
FIG. 4 illustrates an embodiment of the invention in which multiple crucibles containing a metal fluoride raw material are stacked in a crystal growth furnace.

FIG. 4 illustrates an embodiment of the invention in which multiple crucibles containing a metal fluoride raw material are stacked in a crystal growth furnace. When using such stacking the crucibles should be made of a porous material to allow the cleansing plasma and its reaction products to diffuse in-and-out through the walls of the crucible. The metal fluoride material is treated with plasma as described in Example three, though the time for treatment may be extended to a time in the range of 24–120 hours to allow for sufficient diffusion and reaction to occur. Once the plasma treatment has been completed the metal fluoride single crystals are grown as described in Example 3 or as described in patents (for example U.S. Pat. Nos. 6,562,126 and 6,309,461) and publications known to those skilled in the art. This use of this procedure in which raw material treatment and crystal growth take place in the same furnace avoids re-contaminating the plasma-treated metal fluoride material during transfer from a treatment furnace to a growth furnace. The crystal growth furnace illustrated in FIG. 3 is as disclosed in U.S. Pat. No. 6,562,126, and has been modified to have a plasma generator 340 connected to the furnace via connector 350. Not illustrated are a vacuum source, the gas source for the plasma, plasma control equipment, valves, and a source for the entry of selected gases such as inert gases that may be used in the process; all of whose placement are within the ability of one skilled in the art.

While the invention has been described with respect to a limited number of embodiments, those skilled in the art, having benefit of this disclosure, will appreciate that other embodiments can be devised which do not depart from the scope of the invention as disclosed herein.

We claim:

1. A method for growing a metal fluoride single crystal, said method comprising the steps of:
   placing a metal fluoride material of formula $MF_2$ in a vessel;
   placing the vessel in a crystal growth furnace;
   reducing a pressure in the crystal growth furnace to a pressure of less than $10^{-3}$ mm Hg;
   exposing the fluoride material and surfaces in the furnace to a halogen containing plasma at a pressure in the range of 0.1–150 mm Hg at temperature in the range 200–800° C. for a selected time in the range of 1–120 hours;
   stopping the flow of plasma and reducing the pressure in the furnace to less than $10^{-3}$ mm Hg;
   heating the fluoride material to a temperature above its melting point; and
   cooling the melted fluoride material, using a selected time and temperature cycle to form a metal fluoride single crystal suitable for below 200 nm optical lithography
   wherein M is selected from the group consisting of calcium, barium, magnesium and strontium, and mixtures thereof.

2. The method according to claim 1, wherein the halogen containing plasma is generated from a halogenated substance selected from the group consisting of fluorocarbons, chlorocarbons, chlorofluorocarbons, boron tifluoride, boron trichloride; chlorine, fluorine, and xenon difluoride.

3. The method according to claim 2, wherein the plasma is generated using a fluorine containing gas selected from the group consisting of $C_1$–$C_4$ fluorocarbons, including cyclo-$C_4F_8$, $F_2$, and $XeF_2$.

4. The method according to claim 1 wherein the vessel containing the metal fluoride material is a porous carbon vessel that may optionally include a lid.

5. The method of claim 1, wherein said method is used to grow a mixed-metal fluoride crystal of formula $M_{1-x}M'_xF_2$, where, M and M' are different and each is selected from the group consisting of calcium, barium, magnesium and strontium, and x is greater than zero and less than 1.

6. A method for purifying metal fluorides, said process comprising the steps of:
   placing a metal fluoride material of general formula $MF_2$ in a vessel, placing the vessel in a furnace, and exposing the material to a halogen containing plasma at a pressure in the range of 0.1–150 mm Hg and a temperature in the range 200–800° C. for a selected time in the range of 1–120 hours;
   wherein M is selected from the group consisting of calcium, barium, magnesium and strontium, and mixtures thereof.

7. The method according to claims 6, wherein the temperature is in the range of 200–500° C.

8. The method according to claim 6, wherein the temperature is in the range of 200–300° C.

9. The method according to claim 6, wherein the halogen containing plasma is generated from a halogenated substance selected from the group consisting of fluorocarbons, chlorocarbons, chlorofluorocarbons, boron trifluoride, boron trichloride, chlorine, fluorine, and xenon difluoride.

10. The method according to claim 6, wherein the furnace is a crystal growth furnace capable of reaching a temperature greater than the melting point of the metal fluoride material.

11. The method according to claim 10 wherein the method further comprises the crystal growth steps of:
    heating the fluoride material to a temperature above its melting point; and
    cooling the melted fluoride material using a selected time and temperature cycle to form a metal fluoride single crystal suitable for below 200 nm optical lithography.

* * * * *